US011072555B2

(12) United States Patent
Vallepu et al.

(10) Patent No.: US 11,072,555 B2
(45) Date of Patent: Jul. 27, 2021

(54) GLASS MEMBER

(71) Applicant: COORSTEK KK, Tokyo (JP)

(72) Inventors: Ramesh Vallepu, Kanagawa (JP); Yu Yokoyama, Kanagawa (JP); Mitsuhiro Fujita, Kanagawa (JP); Masako Uematsu, Kanagawa (JP); Yukiko Kikuchi, Kanagawa (JP)

(73) Assignee: COORSTEK KK, Tokyo (JP)

( * ) Notice: Subject to any disclaimer, the term of this patent is extended or adjusted under 35 U.S.C. 154(b) by 0 days.

(21) Appl. No.: 16/290,634

(22) Filed: Mar. 1, 2019

(65) Prior Publication Data
US 2019/0270665 A1 Sep. 5, 2019

(30) Foreign Application Priority Data

Mar. 2, 2018 (JP) .............................. JP2018-037782
Feb. 14, 2019 (JP) .............................. JP2019-024506

(51) Int. Cl.
C03C 3/093 (2006.01)
H01L 33/50 (2010.01)
C03C 3/085 (2006.01)

(52) U.S. Cl.
CPC .............. C03C 3/093 (2013.01); C03C 3/085 (2013.01); H01L 33/502 (2013.01); C03C 2201/24 (2013.01)

(58) Field of Classification Search
CPC ........... C03C 3/091; C03C 8/12; C03C 34/12; C03C 14/004; C03C 4/12; C03C 10/0009; C03C 3/085; C03C 3/093; C09K 11/77; C09K 11/7715; C09K 11/0883; H01L 33/502; H01L 2933/00; H02L 2933/00
See application file for complete search history.

(56) References Cited

U.S. PATENT DOCUMENTS

| 5,998,925 | A | 12/1999 | Shimizu et al. |
| 6,069,440 | A | 5/2000 | Shimizu et al. |
| 6,614,179 | B1 | 9/2003 | Shimizu et al. |
| 2001/0001207 | A1 | 5/2001 | Shimizu et al. |
| 2004/0000868 | A1 | 1/2004 | Shimizu et al. |
| 2004/0004437 | A1 | 1/2004 | Shimizu et al. |
| 2004/0090180 | A1 | 5/2004 | Shimizu et al. |
| 2004/0222435 | A1 | 11/2004 | Shimizu et al. |
| 2005/0280357 | A1 | 12/2005 | Shimizu et al. |
| 2007/0114914 | A1 | 5/2007 | Shimizu et al. |
| 2007/0159060 | A1 | 7/2007 | Shimizu et al. |
| 2008/0138918 | A1 | 6/2008 | Shimizu et al. |
| 2009/0091235 | A1* | 4/2009 | Matsuo .................. H01J 61/09 313/486 |
| 2009/0315014 | A1 | 12/2009 | Shimizu et al. |
| 2009/0315015 | A1 | 12/2009 | Shimizu et al. |
| 2009/0316068 | A1 | 12/2009 | Shimizu et al. |
| 2010/0001258 | A1 | 1/2010 | Shimizu et al. |
| 2010/0006819 | A1 | 1/2010 | Shimizu et al. |
| 2010/0019224 | A1 | 1/2010 | Shimizu et al. |
| 2010/0019270 | A1 | 1/2010 | Shimizu et al. |
| 2010/0117516 | A1 | 5/2010 | Shimizu et al. |
| 2010/0264841 | A1 | 10/2010 | Shimizu et al. |
| 2010/0264842 | A1 | 10/2010 | Shimizu et al. |
| 2011/0053299 | A1 | 3/2011 | Shimizu et al. |
| 2011/0062864 | A1 | 3/2011 | Shimizu et al. |
| 2011/0297990 | A1 | 12/2011 | Shimizu et al. |
| 2012/0057337 | A1* | 3/2012 | Liebald .................. C03C 3/068 362/231 |
| 2013/0134859 | A1* | 5/2013 | Imakita ................. C04B 35/117 313/317 |
| 2014/0084323 | A1 | 3/2014 | Shimizu et al. |
| 2014/0140071 | A1* | 5/2014 | Daicho ................. C09K 11/715 362/317 |
| 2016/0075592 | A1* | 3/2016 | Nagashima ............. C03C 3/068 349/69 |
| 2018/0179101 | A1* | 6/2018 | Duman .................... C03C 3/095 |
| 2019/0112524 | A1* | 4/2019 | Fujita ...................... C03C 14/00 |
| 2019/0119148 | A1* | 4/2019 | Fujita ................. C09K 11/7718 |

(Continued)

FOREIGN PATENT DOCUMENTS

JP 2000-208815 A 7/2000
JP 2015-199640 A 11/2015

(Continued)

OTHER PUBLICATIONS

Sigma-Aldrich, "Phosphors-Phosphor Materials", Feb. 12, 2013, accessed from https://web.archive.org/web/20130212154359/https://www.sigmaaldrich.com/materials-science/material-science-products.html?TablePage=112202335 (Year: 2013).*

(Continued)

Primary Examiner — Jennifer A Smith
Assistant Examiner — Amanda Garley
(74) Attorney, Agent, or Firm — Procopio, Cory, Hargreaves & Savitch LLP

(57) ABSTRACT

The present invention relates to a glass member in which an inorganic phosphor is dispersed in a glass matrix, in which the glass member includes an $SiO_2$—$B_2O_3$ based glass as the glass matrix, and the $SiO_2$—$B_2O_3$ based glass includes $SiO_2$ as a main component thereof, and includes, based on a total amount of the $SiO_2$—$B_2O_3$ based glass: $Al_2O_3$ in an amount of 4 to 10 wt %; and MgO and ZnO in a total amount of 0.1 to 0.7 wt %.

7 Claims, No Drawings

(56) References Cited

U.S. PATENT DOCUMENTS

| | | | |
|---|---|---|---|
| 2019/0171093 A1* | 6/2019 | Furuyama | C03C 8/16 |
| 2019/0241456 A1* | 8/2019 | Shimizu | C03C 14/006 |
| 2020/0035872 A1* | 1/2020 | Furuyama | H01L 33/44 |

FOREIGN PATENT DOCUMENTS

| | | | | |
|---|---|---|---|---|
| JP | 2016-013945 A | | 1/2016 | |
| JP | 2018002491 A | * | 1/2018 | C03C 3/091 |
| WO | WO-2017044202 A1 | * | 3/2017 | C09K 11/778 |
| WO | WO-2018037856 A1 | * | 3/2018 | H01L 33/50 |

OTHER PUBLICATIONS

Li, S. et al "Al2O3-YAG:Ce composite phosphor ceramic: a thermally robust and efficient color converter for solid state laser lighting", J. Mater. Chem. C, 2016, 4, 8648, accessed from https://pubs.rsc.org/en/content/articlepdf/2016/tc/c6tc03215j (Year: 2016).*

* cited by examiner

GLASS MEMBER

FIELD OF THE INVENTION

The present invention relates to a glass member for a wavelength conversion member which converts a wavelength of light emitted by an LED (Light Emitting Diode), an LD (Laser Diode) or the like.

BACKGROUND OF THE INVENTION

In recent years, research and development of a lighting system using a semiconductor light emitting element such as an LED and an LD as a light source have been carried out actively, and its presence as an energy-saving light emitting device has been increased. In such an energy-saving light emitting device, for example, a wavelength conversion member is disposed on an LED which emits blue light. The wavelength conversion member absorbs a part of the light from the LED and converts the absorbed light into yellow light. The blue light emitted from the LED and the yellow light emitted from the wavelength conversion member are combined into white light. Thus, the white light is emitted.

In a wavelength conversion member known in the background art, an inorganic phosphor is dispersed in a resin matrix. When such a wavelength conversion member is used in a light emitting device, the resin is degraded due to heat generated by the LED or short-wavelength light with high energy, so that the luminance of the light emitting device tends to decrease. Therefore, there has been proposed a wavelength conversion member including a completely inorganic solid in which a phosphor is dispersed and fixed in a glass matrix in place of resin. For example, Patent Document 1 discloses a wavelength conversion member with less chronological deterioration in light emission intensity. In the wavelength conversion member, an inorganic phosphor is dispersed in a glass matrix. The glass matrix contains $SiO_2$, $B_2O_3$, $Al_2O_3$, $Li_2O$, $Na_2O$, $K_2O$, MgO, CaO, SrO, BaO and ZnO. The inorganic phosphor is an oxide phosphor containing those oxides, a nitride phosphor, etc. Patent Document 2 discloses a glass for use as a wavelength conversion material which can reduce characteristic deterioration of an inorganic phosphor during baking and which is excellent in mechanical strength and weatherability. The glass contains $SiO_2$, $B_2O_3$, $Al_2O_3$, $Li_2O$, $Na_2O$, $K_2O$, MgO, CaO, SrO and ZnO, and has a softening point of less than 700° C. According to the wavelength conversion members disclosed in Patent Documents 1 and 2, the glass matrix serving as a base material is less apt to deteriorate due to heat from an LED or irradiation light. Thus, there rarely arises a problem such as discoloration or deformation.

On the other hand, Patent Document 3 discloses a light emitting diode including a light emitting element which can emit blue light, a coating portion which is provided on the light emitting element, and a mold member which protects the coating portion. The light emitting element has a light emitting layer which is formed on a substrate and made of a gallium nitride compound semiconductor. In the light emitting diode disclosed in Patent Document 3, the coating portion includes a yellow photoluminescent phosphor which absorbs at least a part of the blue light from the light emitting element to convert the wavelength of the light and emit fluorescent light. The mold member contains a dispersing agent which makes the mold member opalescent.

Patent Document 1: JP-A-2015-199640
Patent Document 2: JP-A-2016-13945
Patent Document 3: JP-A-2000-208815

SUMMARY OF THE INVENTION

Recently, with higher power of light emitting devices, LEDs or LDs serving as light sources are demanded to have higher output. However, there arises a problem that the temperature of a wavelength converter increases due to heat of a light source or heat generated from a phosphor irradiated with excitation light so that light emission intensity is chronologically reduced, or in some cases a constituent material is degraded.

Therefore, an object of the present invention is to provide a glass member for a wavelength conversion member, which is so excellent in durability that reduction in light emission intensity or deterioration of a constituent material can be suppressed even when the glass member is irradiated with light from an LED or an LD.

Namely, the present invention relates to the following (1) to (3).

(1) A glass member in which an inorganic phosphor is dispersed in a glass matrix, in which the glass member includes an $SiO_2$—$B_2O_3$ based glass as the glass matrix, and the $SiO_2$—$B_2O_3$ based glass includes $SiO_2$ as a main component thereof, and includes, based on a total amount of the $SiO_2$—$B_2O_3$ based glass: $Al_2O_3$ in an amount of 4 to 10 wt %; and MgO and ZnO in a total amount of 0.1 to 0.7 wt %.

(2) The glass member according to (1), in which the inorganic phosphor is contained in an amount of 10 vol % or more and 40 vol % or less based on a total volume of the glass member.

(3) The glass member according to (1) or (2), in which a cristobalite ratio in a glass region of the glass member is 1% or less.

The glass member according to the present invention can be suitably used for a wavelength conversion member since the glass member has high emission light intensity and excellent durability.

DETAILED DESCRIPTION OF THE INVENTION

A glass member according to the present invention will be described below in detail.

In the glass member according to the present invention, an inorganic phosphor is dispersed in a glass matrix. The glass member includes an $SiO_2$—$B_2O_3$ based glass as the glass matrix. The $SiO_2$—$B_2O_3$ based glass includes $SiO_2$ as a main component thereof, and includes $Al_2O_3$ in an amount of 4 to 10 wt %, and MgO and ZnO in a total amount of 0.1 to 0.7 wt %. Here, the total amount of the $SiO_2$—$B_2O_3$ based glass, namely the total amount of $SiO_2$, $B_2O_3$, $Al_2O_3$, MgO, ZnO and the remainder is taken as 100 wt %.

That is, the glass member includes at least $SiO_2$, $B_2O_3$, $Al_2O_3$, and ZnO and/or MgO.

$SiO_2$ which is a main component of the $SiO_2$—$B_2O_3$ based glass is a component forming a glass network. The content of $SiO_2$ is specifically 60 to 70 wt %, and more preferably 62 to 65 wt % based on the total amount of the $SiO_2$—$B_2O_3$ based glass. When the content of $SiO_2$ is too small, crystallization of a glass part tends to proceed, and scattering of light in the glass member increases as the crystallization proceeds. That is, the optical path length of light propagated in the glass member is elongated so that emission light intensity tends to decrease due to a large optical loss. On the other hand, when the content of $SiO_2$ is too large, meltability of the glass deteriorates so that the glass must be melted at a higher temperature to manufacture the glass member. Thus, due to deterioration of the inorganic phosphor caused by the high temperature heat treatment, the wavelength conversion efficiency tends to be lowered.

$B_2O_3$ is a component which can decrease the melting temperature of the glass to thereby extremely improve the meltability thereof. The content of $B_2O_3$ is preferably 15 to 25 wt % based on the total amount of the $SiO_2$—$B_2O_3$ based glass. When the content of $B_2O_3$ is less than 15 wt %, the effect of improving the meltability of the glass is so insufficient that the glass must be melted at a high temperature to manufacture the glass member. Thus, due to deterioration of the inorganic phosphor caused by the high temperature heat treatment, the wavelength conversion efficiency tends to be lowered. On the other hand, when the content of $B_2O_3$ exceeds 25 wt %, waterproofness or the like in the glass part of the glass member deteriorates. Thus, the durability as the glass member may deteriorate.

$Al_2O_3$ is a component which can suppress the glass from being formed as cristobalite, and also improve the durability and the mechanical strength thereof. The content of $Al_2O_3$ is 4 to 10 wt %, and preferably 7 to 9 wt % based on the total amount of the $SiO_2$—$B_2O_3$ based glass. When the content of $Al_2O_3$ is less than 4 wt %, the effect of suppressing the glass from being formed as cristobalite cannot be obtained sufficiently. Thus, a glass region in the glass member tends to be formed as cristobalite, so that scattering of light in the glass member tends to increase. That is, since the formation of the cristobalite is proceeded, many crystal nuclei grow to form aggregates of crystal grains and the optical path length are elongated. Thus, due to increase in optical loss, the emission light intensity tends to be lowered. On the other hand, when the content of $Al_2O_3$ exceeds 10 wt %, the waterproofness in the glass part of the glass member deteriorates. Thus, the durability as the glass member tends to deteriorate.

MgO and ZnO are components which can decrease the melting temperature of the glass to thereby improve the meltability thereof. MgO and ZnO also serve as components which can decrease the softening point of the glass. The total content of MgO and ZnO is 0.1 to 0.7 wt %, and preferably 0.4 to 0.6 wt % based on the total amount of the $SiO_2$—$B_2O_3$ based glass. When the total content of MgO and ZnO is less than 0.1 wt %, the effect of improving the meltability of the glass is so insufficient that the glass must be melted at a high temperature to manufacture the glass member. Thus, due to deterioration of the inorganic phosphor caused by the high temperature heat treatment, the wavelength conversion efficiency tends to be lowered. On the other hand, when the total content of MgO and ZnO exceeds 0.7 wt %, waterproofness or the like in the glass part deteriorates. Thus, the durability as the glass member tends to deteriorate.

The inorganic phosphor is a general inorganic phosphor such as a phosphor of a garnet-based compound (such as YAG:Ce), a phosphor of nitride (such as $CaAlSiN_3$), a phosphor of oxynitride (such as α-sialon (SiAlON) or β-sialon), etc.

Such an inorganic phosphor is larger in refractive index than the glass. For example, in the glass member for wavelength conversion, assume that an inorganic phosphor having a large refractive index and a glass having a small refractive index are used in combination. In this case, excitation light is scattered in the interface between the inorganic phosphor and the glass matrix. When there is a large difference in refractive index between the both, the irradiation efficiency of the excitation light on the inorganic phosphor is enhanced to improve the wavelength conversion efficiency. However, when the difference in refractive index between the both is too large, the excitation light is scattered excessively to cause a scattering loss. Thus, the wavelength conversion efficiency is lowered.

The content of the inorganic phosphor in the glass member is preferably 10 vol % or more and 40 vol % or less, and more preferably 14 vol % or more and 26 vol % or less, based on the total volume of the glass member. When the content of the inorganic phosphor is 10 vol % or more and 40 vol % or less, the quantity of light with a wavelength which can be transmitted through the glass member increases, while the quantity of light scattered or reflected by the inorganic phosphor decreases. Thus, the emission light intensity increases. When the content of the inorganic phosphor is less than 10 vol %, it may be difficult to obtain desired emission light intensity. On the other hand, when the content of the inorganic phosphor exceeds 40 vol %, the inorganic phosphor is less apt to be dispersed in the glass matrix. In addition, due to increase in porosity, the inorganic phosphor is hardly irradiated with the excitation light efficiently. In addition, the mechanical strength of the glass member tends to be lowered.

In the glass member, the inorganic phosphor is dispersed in the glass matrix. The shape of the glass which has not been subjected to the high temperature heat treatment yet is preferably powdery because the glass is to be uniformly mixed with the powdery inorganic phosphor and subjected to the high temperature heat treatment. When the glass is powdery, it is preferable that a maximum particle size (Dmax) thereof is 150 μm or less and an average particle size (D50) thereof is 0.1 μm or more, based on a laser diffraction method. When the maximum particle size (Dmax) exceeds 150 μm, excitation light is hardly scattered in a wavelength conversion member obtained therefrom. Thus, the light emission efficiency tends to be lowered. On the other hand, when the average particle size (D50) is less than 0.1 μm, excitation light is excessively scattered in the glass member. Thus, the light emission efficiency tends to be lowered. It is more preferable that the maximum particle size (Dmax) is 30 μm or less and the average particle size (D50) is 0.5 μm or more and 10 μm or less. In addition, the softening point of the glass is preferably 400 to 850° C., and more preferably 500 to 810° C. When the softening point is less than 400° C., the mechanical strength and the durability of the glass member tend to be lowered. On the other hand, when the softening point exceeds 850° C., the heat treatment temperature of the wavelength conversion material becomes so high that the inorganic phosphor tends to deteriorate during the heat treatment.

The $SiO_2$—$B_2O_3$ based glass according to the present invention may contain a slight amount of other metals or metal oxides as long as they do not impair the effect of the present invention, in addition to the above-described components of $SiO_2$, $B_2O_3$, $Al_2O_3$, MgO and ZnO. For example, components such as $Li_2O$, $Na_2O$ and $K_2O$ may be contained. These components are components which decrease the melting point of the glass to thereby improve the meltability. However, these components decrease the softening point of the glass. Therefore, in order to maintain the durability, the total content of these components is set at about 0.01 to 5 wt % based on the total amount of the $SiO_2$—$B_2O_3$ based glass.

The cristobalite ratio in a glass phase (the glass region) of the glass member is preferably 1% or less. When the cristobalite ratio is 1% or less, light scattering in the glass member hardly increases. Thus, the optical loss does not increase, which leads to improvement of the emission light intensity, that is, the light emission efficiency. The content of such a glass phase is preferably 60 to 80 wt % in the glass member. Also, the porosity of the glass member is preferably 0.1% or less.

The glass member according to the present invention is manufactured by baking a molded body including a mixture of the glass and the inorganic phosphor. The baking temperature is within a range of the softening point of the glass ±150° C. When the baking temperature is too low, the glass cannot flow. Thus, a dense sintered body is hardly obtained. On the other hand, when the baking temperature is too high, the inorganic phosphor may react in the glass to lower the emission light intensity, or a component contained in the inorganic phosphor may be dispersed into the glass so as to color the glass to thereby lower the emission light intensity. Further, deformation of the shape, segregation of the composition, etc. may occur.

Baking is carried out under the atmosphere. In this manner, the quantity of bubbles remaining in the glass member can be reduced. As a result, scattering factors in the glass member can be reduced so that the light emission efficiency can be improved.

The glass member according to the present invention is, for example, suitably used as a wavelength conversion member for a general lighting such as a white LED, a projector light source, a headlamp light source of a car, etc. In addition, the shape of the glass member is not particularly limited. For example, the glass member may be used as a member itself having a specific shape such as a sheet-like shape, a columnar shape, a hemispherical shape, a hemispherical dome-like shape, etc., or may be a sintered body formed like a film on a surface of a substrate such as a glass substrate or a ceramic substrate.

EXAMPLES

The present invention will be described specifically based on Examples. The present invention is not limited by the following Examples.

Examples 1 to 14 and Comparative Examples 1 to 4

Glass powder and inorganic phosphor powder as shown in Table I and binder were mixed, and then molded. Thus, a molded body 20 mm square and 0.25 mm thick was produced. Next, each molded body thus-produced was heated and melted in the atmosphere at 800° C. for 30 minutes to obtain a glass member in which inorganic phosphor was dispersed. Light emission efficiency of the obtained glass member was measured. The glass member to be subjected to this test was processed into a sample 1 mm square, and then fixed onto a blue LED element (light emission area: 1 mm square, emission light wavelength: 460 nm) by silicone resin.

In an integrating sphere, blue light was irradiated on the inorganic phosphor, and a fluorescence spectrum was measured by a spectrometer. Absorbed energy and fluorescence energy were obtained from the obtained fluorescence spectrum. The ratio between the both was regarded as light emission efficiency.

Next, the glass member was left as it was for 1,000 hours under the conditions of a temperature of 85° C. and a humidity of 85%. After that, the light emission efficiency was measured in the same manner as described above. When reduction in light emission efficiency was 2% or less, durability was regarded as good (A). When reduction in light emission efficiency exceeded 2%, durability was regarded as not good (B).

The cristobalite ratio was measured by a 0-20 method performed by a powder X-ray diffractometry, and calculated based on a ratio of a peak area of crystalline components to a peak area (peak area of crystalline components+halo pattern area of amorphous components) appearing near 22°. When the cristobalite ratio was within 1%, it was regarded as good (A). When the cristobalite ratio exceeded 1%, it was regarded as not good (B).

TABLE 1

| | $SiO_2$[1] | $B_2O_3$[1] | $Al_2O_3$[1] | $MgO + ZnO$[1] | Remainder[1] | Inorganic phosphor content[2] | Light emission efficiency | Durability | Cristobalite ratio |
|---|---|---|---|---|---|---|---|---|---|
| Comp. Ex. 1 | 65 | 20 | 3 | 0.5 | 11.5 | 25 | 90% | A | B |
| Ex. 1 | 65 | 20 | 4 | 0.5 | 10.5 | 25 | 95% | A | A |
| Ex. 2 | 65 | 20 | 6.5 | 0.5 | 8 | 25 | 95% | A | A |
| Ex. 3 | 65 | 20 | 8.5 | 0.5 | 6 | 25 | 95% | A | A |
| Ex. 4 | 65 | 20 | 10 | 0.5 | 4.5 | 25 | 95% | A | A |
| Comp. Ex. 2 | 65 | 20 | 11 | 0.5 | 3.5 | 25 | 95% | B | A |
| Comp. Ex. 3 | 65 | 20 | 6.5 | 0 | 8.5 | 25 | 91% | A | A |
| Ex. 5 | 65 | 20 | 6.5 | 0.1 | 8.4 | 25 | 95% | A | A |
| Ex. 6 | 65 | 20 | 6.5 | 0.7 | 7.8 | 25 | 95% | A | A |
| Comp. Ex. 4 | 65 | 20 | 6.5 | 0.8 | 7.7 | 25 | 95% | B | A |
| Ex. 7 | 65 | 20 | 6.5 | 0.5 | 8 | 9 | 92% | A | A |
| Ex. 8 | 65 | 20 | 6.5 | 0.5 | 8 | 10 | 93% | A | A |
| Ex. 9 | 65 | 20 | 6.5 | 0.5 | 8 | 15 | 93% | A | A |
| Ex. 10 | 65 | 20 | 6.5 | 0.5 | 8 | 20 | 94% | A | A |
| Ex. 11 | 65 | 20 | 6.5 | 0.5 | 8 | 30 | 96% | A | A |
| Ex. 12 | 65 | 20 | 6.5 | 0.5 | 8 | 35 | 96% | A | A |
| Ex. 13 | 65 | 20 | 6.5 | 0.5 | 8 | 40 | 93% | A | A |
| Ex. 14 | 65 | 20 | 6.5 | 0.5 | 8 | 41 | 92% | A | A |

[1] Unit of each value is wt %.
[2] Unit of each value is wt %. Each value shows the content (vol %) of inorganic phosphor to the total 100 vol % of glass matrix ($SiO_2$, $B_2O_3$, $Al_2O_3$, $MgO + ZnO$ and the remainder) and the inorganic phosphor.
[3] Each value shows the content of the remainder which is the total content (wt %) of $BaO$, $CaO$, $Fe_2O_3$, $K_2O$, $Li_2O$, $Na_2O$, $SnO$, $SrO$ and $TiO_2$.

In Comparative Example 1 where the content of $Al_2O_3$ was small, the cristobalite ratio exceeded 1%. It is considered that the reason therefor is that the formation of cristobalite proceeded inside the glass.

In Comparative Example 3, the light emission efficiency was 91%, and the emission light intensity was lowered.

On the other hand, in Comparative Example 2 where the content of $Al_2O_3$ was large and Comparative Example 4 where the total content of MgO and ZnO was large, the durability was lowered.

The present application is based on Japanese patent application No. 2018-037782 filed on Mar. 2, 2018 and Japanese patent application No. 2019-024506 filed on Feb. 14, 2019, and the contents of which are incorporated herein by reference.

What is claimed is:

1. A glass member for wavelength conversion in which an inorganic phosphor is dispersed in a glass matrix, wherein:
    the glass matrix comprises a $SiO_2$—$B_2O_3$ based glass as the glass matrix, and
    the $SiO_2$—$B_2O_3$ based glass comprises, based on a total amount of the $SiO_2$—$B_2O_3$ based glass: $SiO_2$ in an amount of 60 to 70 wt %; $B_2O_3$ in an amount of 15 to 25 wt %; $Al_2O_3$ in an amount of 4 to 10 wt %; MgO and ZnO in a total amount of 0.1 to 0.7 wt %; and other metals or metal oxides in a total amount of 0.01 to 5 wt %; and
    the inorganic phosphor is contained in an amount of 25 vol % or more and 35 vol % or less based on a total volume of the glass member and comprises one or more of a phosphor of a garnet-based compound, a phosphor of nitride, or a phosphor of oxynitride, which are larger in refractive index than the $SiO_2$—$B_2O_3$ based glass.

2. The glass member for wavelength conversion according to claim 1, wherein a cristobalite ratio in a glass region of the glass member is 1% or less.

3. The glass member for wavelength conversion according to claim 1,
    wherein a shape of the $SiO_2$—$B_2O_3$ based glass which has not been subjected to a high temperature heat treatment yet during production of the glass member for wavelength conversion is powdery, and
    a maximum particle size (Dmax) thereof is 150 μm or less and an average particle size (D50) thereof is 0.1 μm or more, based on a laser diffraction method.

4. The glass member for wavelength conversion according to claim 2, wherein a content of the glass region is 60 to 80 wt % in the glass member.

5. The glass member for wavelength conversion according to claim 1, wherein the phosphor is a phosphor of nitride or a phosphor of oxynitride.

6. The glass member for wavelength conversion according to claim 1, wherein the nitride is $CaAlSiN_3$.

7. The glass member for wavelength conversion according to claim 1, wherein the oxynitride is α-sialon or β-sialon.

* * * * *